United States Patent [19]

Sherman

[11] Patent Number: 5,465,604
[45] Date of Patent: Nov. 14, 1995

[54] METHOD FOR ADJUSTING SENSITIVITY OF A SENSOR

[75] Inventor: Steven J. Sherman, Andover, Mass.

[73] Assignee: Analog Devices, Inc.

[21] Appl. No.: 226,771

[22] Filed: Apr. 12, 1994

Related U.S. Application Data

[62] Division of Ser. No. 28,922, Mar. 4, 1993, Pat. No. 5,345,824, which is a continuation of Ser. No. 569,080, Aug. 17, 1990, abandoned.

[51] Int. Cl.$^6$ .................................................. G01L 25/00
[52] U.S. Cl. ........................................ 73/1 DV; 73/514.18
[58] Field of Search ................................ 73/1 D, 1 DV, 73/517 R, 517 B

[56] References Cited

U.S. PATENT DOCUMENTS

| | | | |
|---|---|---|---|
| 4,711,128 | 12/1987 | Boura | 73/517 B |
| 4,941,354 | 7/1990 | Russell et al. | 73/517 B |
| 5,054,320 | 10/1991 | Yvon | 73/517 B |
| 5,103,667 | 4/1992 | Allen et al. | 73/1 D |
| 5,211,051 | 5/1993 | Kaiser et al. | 73/1 D |
| 5,251,484 | 12/1993 | Mastache | 73/517 A |

Primary Examiner—Hezron E. Williams
Assistant Examiner—Christine K. Oda
Attorney, Agent, or Firm—Wolf, Greenfield & Sacks

[57] ABSTRACT

An accelerometer comprising a microfabricated acceleration sensor and monolithically fabricated signal conditioning circuitry. The sensor comprises a differential capacitor arrangement formed by a pair of capacitors. Each capacitor has two electrodes, one of which it shares electrically in common with the other capacitor. One of the electrodes (e.g., the common electrode) is movable and one of the electrodes is stationary in response to applied acceleration. The electrodes are all formed of polysilicon members suspended above a silicon substrate. Each of the capacitors is formed of a plurality of pairs of electrode segments electrically connected in parallel and, in the case of the movable electrodes, mechanically connected to move in unison. When the substrate is accelerated, the movable electrodes move such that the capacitance of one of the capacitors increases, while that of the other capacitor decreases. The two capacitors are connected to signal conditioning circuitry which converts this differential capacitance into a corresponding voltage. Both open loop and force-balance operation are shown. A full scale sensitivity is set based on a preliminary sensitivity calculation.

3 Claims, 8 Drawing Sheets

METHOD FOR ADJUSTING SENSITIVITY OF A SENSOR

This application is a division of Ser. No. 08/028,922 filed Mar. 4, 1993, U.S. Pat. No. 5,345,824, which is a continuation of Ser. No. 07/569,080 filed Aug. 17, 1990, abandoned.

FIELD OF THE INVENTION

This invention relates to the field of acceleration sensing. More particularly, it relates to a monolithic acceleration sensor with signal conditioning circuitry, all on the same substrate.

BACKGROUND OF THE INVENTION

Acceleration is a physical quantity which often must be sensed or measured. For example, acceleration is often sensed to measure force or mass, or to operate some kind of control system. In an automotive environment, acceleration may be sensed to control braking systems or to trigger safety devices, such as air bags, in the event of a collision. The present invention is intended for use in such automotive systems, but it is certainly useful, as well, in many other situations.

At the heart of any acceleration measurement is an acceleration-sensing element, or transducer. The transducer is often mechanical or electromechanical (e.g., piezo-electric, piezo-resistive or strain gauge), and may be interfaced to electrical signal conditioning circuits for providing a useful output signal. The term "accelerometer" is often employed to refer to the combination of transducer and signal conditioner. Though some individuals also refer to the transducer, or sensor, itself as an accelerometer, the convention adopted herein is to limit the use of the term "accelerometer" to the aforementioned combination.

A variety of factors enter into the design of an accelerometer, some relating to the sensor and some relating to the circuitry. Among those factors are the following: size, cost, power requirements, reliability, sensitivity, linearity, accuracy, frequency response, full scale range, and temperature- and supply-sensitivity. The relative importance of these factors will depend on how the accelerometer is used. For example, high-frequency response is important when measuring the acceleration of a very small mass acted upon by a large, pulse-like force, whereas such high-frequency response will probably be unimportant if a large mass is excited only by small forces having negligible high-frequency components.

Currently, macroscopically assembled 10 g accelerometers with 1% full scale linearity and 5% accuracy cost about $300. They are constructed with stainless steel beams and silicon strain gauges, and are damped with silicon oil. When subject to shock much greater than 10 g's, these devices are prone to fracture. This quality, and its cost, greatly limits the utility of such devices.

Among the most important specifications for an accelerometer used to control automobile air bags are its cost, long-term reliability in that environment, initial accuracy, temperature stability and linearity. Prior air bag control systems have used a number of mechanical sensors to detect the large decelerations typifying automobile collisions. Multiple redundant sensors are usually used, to ensure reliable control system operation. There is no way of verifying their reliability over a long time, or at any time after initial installation, and their accuracy cannot be ensured over time. Additionally, it would be advantageous to employ accelerometers which provide "signature" data, such as the acceleration versus-time profile data pertaining to a crash, but such accelerometers have been too expensive for this type of application. The mechanical sensors used in automotive applications do not have this capability.

A recent article, R. T. Howe et al., "Silicon Micromechanics: Sensors And Actuators On A Chip," *I.E.E.E. Spectrum*, Vol. 27, No. 7, July 1990 at 30–35, indicates that several types of silicon accelerometers have been developed. A first type of accelerometer incorporates a bulk-micromachined silicon mass suspended by silicon beams. Ion-implanted piezoresistors on the suspension beams sense the motion of the mass. A second type of accelerometer uses capacitance changes to detect movement of the mass. A third type of silicon accelerometer employs a shift in a physical load to product shift in a structure's resonant frequency.

Figure 1:
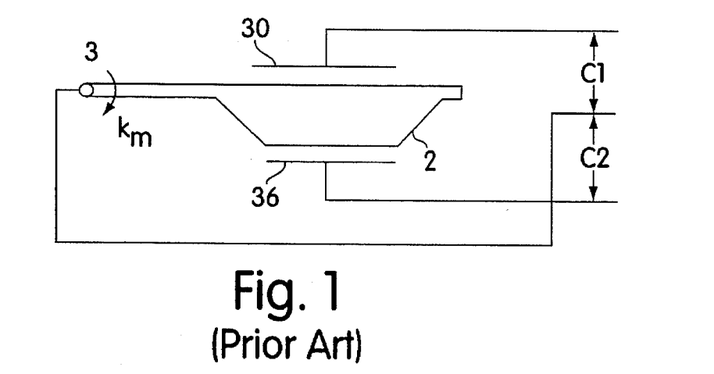
FIG. 1 is a diagrammatic illustration of a prior art capacitive acceleration sensor.
Figure 2:
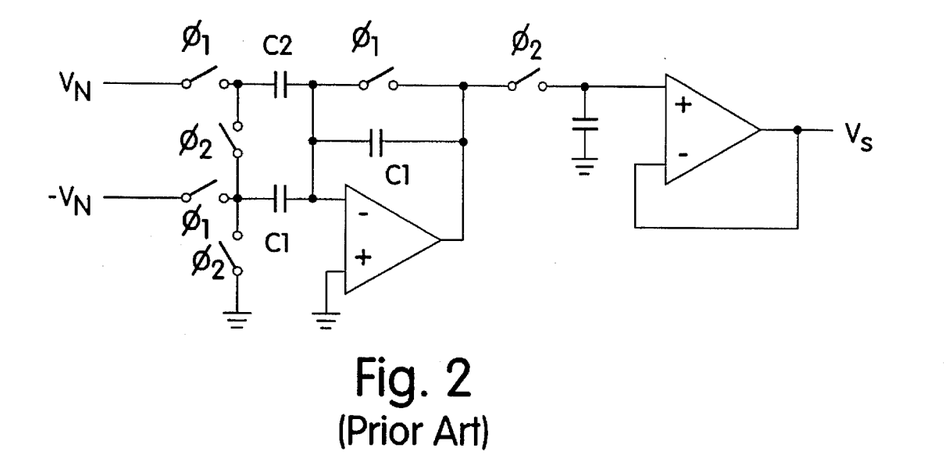
FIG. 2 is a block diagram of a prior art accelerometer signal conditioner employing the sensor of FIG. 1.

As an example of the aforementioned second type of accelerometer, there is reported in the literature a capacitive silicon acceleration sensor which employs a silicon mass rotating about a fixed axis between two plates of a capacitor, in a force-balancing configuration. M. Van Paemel, "Interface Circuit for Capacitive Accelerometer," Sensors and Actuators, Vol. 17, Nos. 3 & 4 (May 17, 1989) at 629–37. FIG. 1, reproduced from that paper, shows schematically the sensor arrangement. As depicted there, a mass 2 can rotate about an axis 3. The mass is suspended between capacitor plates 3a and 3b, defining a first capacitance C1 between plate 3a and the mass, and a second capacitance C2 between the mass and plate 3b. An external acceleration causes the mass to move, changing the capacitances C1 and C2. To measure the capacitances, a voltage is applied, inducing an electrostatic moment. The measurement circuitry basically comprises a switched capacitor summing circuit followed by a sample-and-hold circuit. To linearize the output of this accelerometer, which is quite non-linear, complicated feedback circuits must be added, as shown in FIG. 2.

Details of the construction of the sensor of FIG. 1 are not given in the article, but it does not appear to be monolithically fabricated. Its long-term reliability also is questionable.

Since a calibrated output is desired in many applications, accelerometers (particularly those with mechanical sensors) generally must be subjected to calibrated "g" forces during manufacturing, so that their outputs may be adjusted to the proper values. This adds significant expense to the manufacturing process.

Accordingly, it is an object of the present invention to provide an improved acceleration sensor.

Another object of the invention is to provide an improved accelerometer including a monolithic acceleration sensor and associated signal conditioning circuitry.

Still another object is to provide an accelerometer which is inexpensive.

Yet another object of the invention is to provide an acceleration sensor whose operational status can be tested in situ.

Still another object is to provide an inexpensive accelerometer which is capable of providing an acceleration profile.

A further object of the invention is to provide an accelerometer which can be calibrated without the application of calibrated mechanical "g" forces.

SUMMARY OF THE INVENTION

These and other objects of the invention are achieved in an accelerometer comprising an acceleration sensor and signal conditioning circuitry, which are monolithically fabricated (i.e., on the same substrate). The sensor comprises a differential capacitor arrangement formed by a pair of capacitors. Each capacitor has two electrodes. One of the electrodes is stationary and one of the electrodes is movable in response to applied acceleration. The movable electrodes are connected together both structurally and electrically. The electrodes are all formed of polysilicon members suspended above a silicon substrate. When the substrate is accelerated, the movable electrodes move such that the capacitance of one of the capacitors increases, while that of the other capacitor decreases. The two capacitors are connected to signal conditioning circuitry which converts this differential capacitance into a corresponding voltage. Both open loop and force-balance operation are shown.

Each of the capacitors is formed of a plurality of pairs of plate segments electrically connected in parallel and mechanically connected to move in unison.

The accelerometer can be calibrated without "g" forces being applied, using a wafer-level trim process, to achieve an output which is accurate within about ±5%.

The sensor can be tested by electrostatically applying a force to the capacitors and detecting the change in stored charge which will occur if the capacitors are moving as intended.

The invention will be more fully understood from the detailed description presented below, which should be read in conjunction with the accompanying drawing.

DETAILED DESCRIPTION

Figure 3:
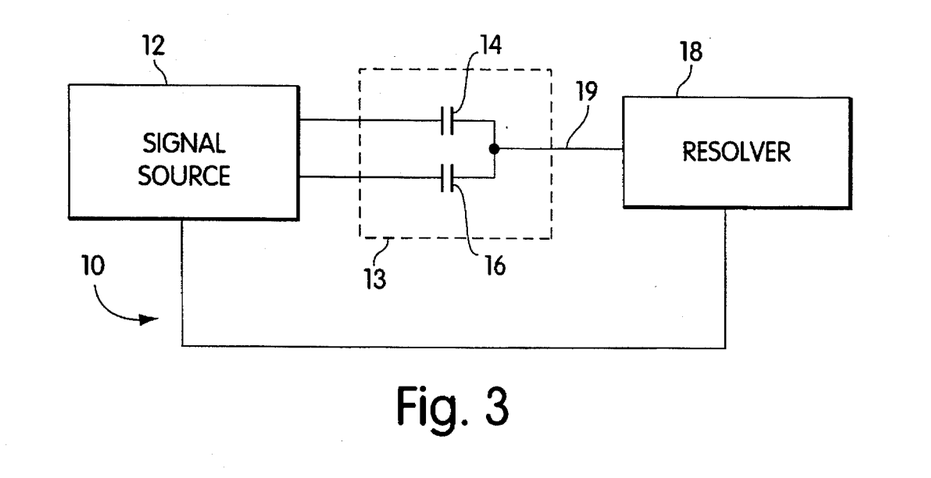
FIG. 3 is a high-level block diagram of a first embodiment of a differential-capacitor accelerometer according to the present invention.

Referring now to FIG. 3, a high-level block diagram is shown of a differential-capacitor accelerometer 10 according to the present invention. The accelerometer 10 comprises a signal source 12, sensor 13 having first and second differential capacitors 14 and 16, and a signal resolver 18. Differential capacitors 14 and 16 are fabricated so that one electrode of each moves when force is applied, such that one capacitance increases and the other decreases. The signal source 12 drives the capacitors 14, 16 with sinusoidal signals of equal frequency and amplitude, but of opposite polarities. Consequently, the amplitude and phase of the signal at the junction 19 of the differential capacitors is a function of the difference in capacitances, which is directly related to the force-induced displacement of the capacitor electrodes due to acceleration. The signal resolver processes this signal, to generate therefrom a signal proportional to the acceleration of the capacitor plates relative to the substrate and package of the assembly.

Figure 4:
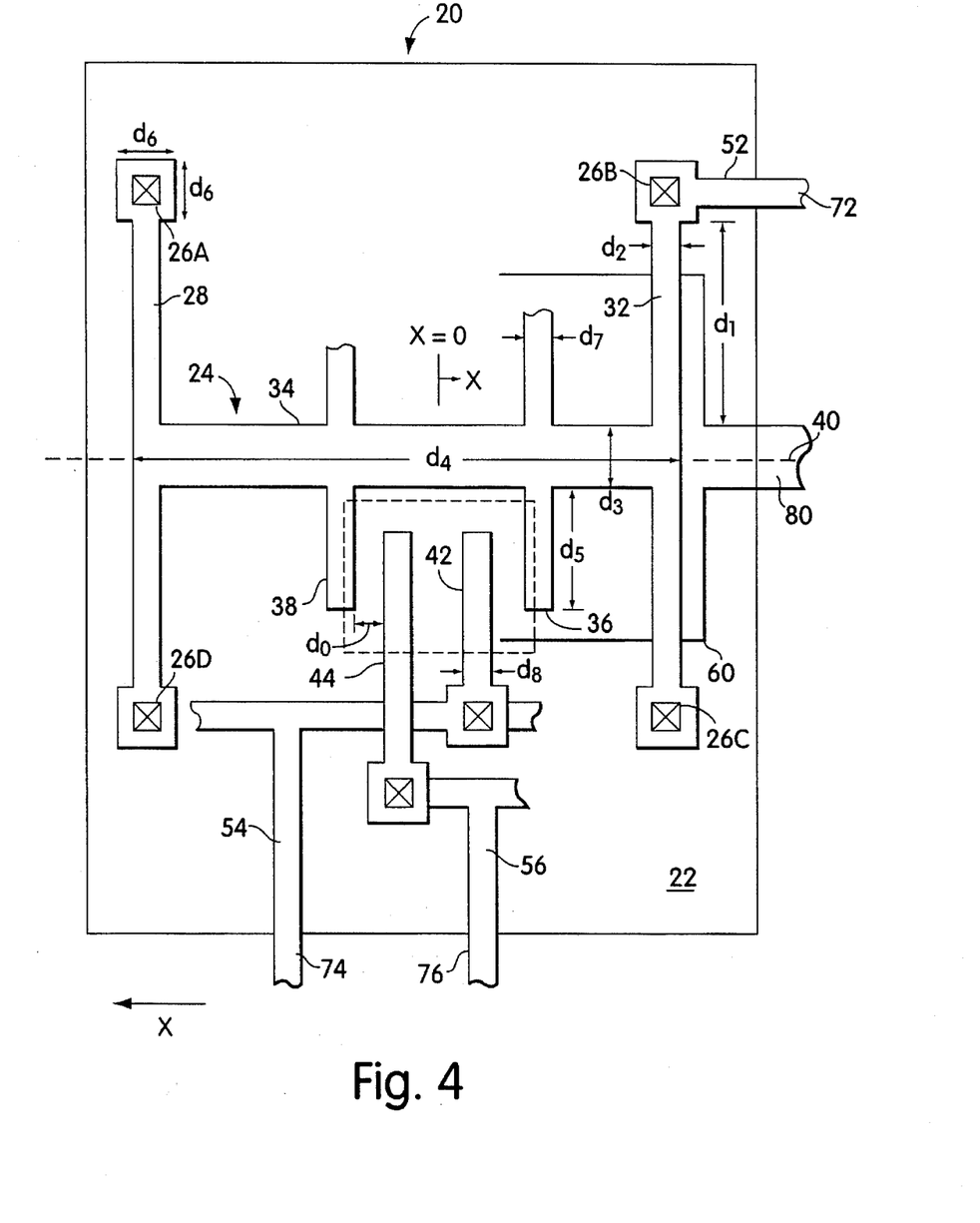
FIG. 4 is a simplified diagrammatic top view of an exemplary differential-capacitor acceleration sensor according to the invention.

Each of the electrodes of a differential capacitor sensor according to the present invention is formed of a plurality of segments which are arranged in such a manner that each capacitor is built up from a plurality of smaller capacitance "cells" connected in parallel. FIG. 4 shows a top view of an exemplary differential-capacitor sensor 20 according to the invention, but with only a single capacitance cell being depicted, to avoid unnecessary obfuscation of the inventive concept. On top of a silicon substrate 22, a suspended polysilicon "beam" 24 is formed. (The method of forming this suspended structure is discussed below.) Beam 24 rests above the surface of the substrate, on four posts, or anchors, 26A–26D, indicated by the "X" symbols in the figure. Beam 24 is generally H-shaped, with two elongated, narrow legs 28 and 32, and a transverse central member 34 suspended between them. Central member 34 is typically much stiffer and more massive than legs 28 and 32. A pair of beam fingers 36 and 38 depend in parallel orientation from central member 34, transversely to the axis 40 of the beam. Finger 36 forms one electrode of a parallel plate capacitor, having a stationary member 42 as its opposite electrode, or plate. Similarly, finger 38 forms one electrode of a second parallel plate capacitor, having a stationary member 44 as its opposite plate. Note that fingers 36 and 38 are connected together both physically and electrically and are, thus, a common electrode.

Electrical connection is made to fingers 36 and 38 via a heavily n+ doped region 52 and the polysilicon bridge itself. Electrical connection is made to plate 42 via a heavily n+ doped region 54, and connection to plate 44 is made via a similar region 56. As will be shown below, regions 54 and 56 may be extended to connect together, in parallel, the similar members of other capacitance cells.

Figure 5:
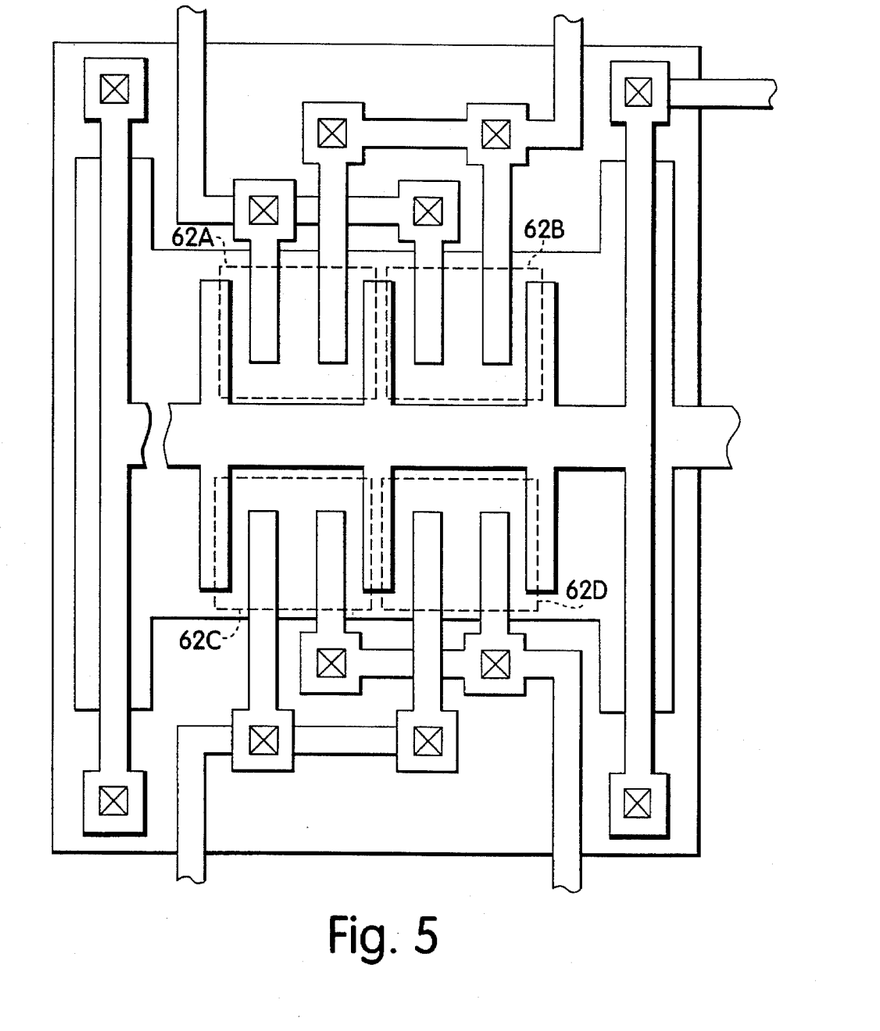
FIG. 5 is a simplified diagrammatic top view of a portion of a sensor according to FIG. 4, with multiple capacitance cells.

An n+ doped region 60 also is provided beneath the entire polysilicon bridge structure, including the capacitance cells, as a bootstrap diffusion for reducing parasitic capacitance from the beam to the substrate. This is necessitated, at least in part, by the very low values of the capacitance per cell. In the example of FIGS. 4 and 5, using the dimensions provided herein, each capacitor has a nominal capacitance of about 0.002 pF. With 56 cells in parallel, the total capacitance at rest is only about 0.1 pF. A full scale measurement involves only about an eight percent change in the value of each capacitor when the sensor is operated open-loop; naturally, in closed-loop operation the change is about ten times less.

The extension of the sensor architecture of FIG. 4 to multiple cells is illustrated in FIG. 5 for a four-cell example, the four cells being labeled 62A–62D.

The approximate dimensions below may be used to fabricate such a sensor, the dimension labels pertaining to the features shown on FIG. 4:

$d_1$=300 micrometers $d_2$=2.0 micrometers $d_3$=40 micrometers $d_4$=450 micrometers $d_5$=125 micrometers $d_6$=8 micrometers $d_7$=5 micrometers $d_8$=3 micrometers For purposes of reference in the discussion below, the heavily-doped, or metallization, regions 52, 54, 56, and 60 are shown as terminating at terminals 72, 74, 76, and 80, respectively, though it should be understood that no actual connection terminal need be present at those physical locations.

When a force is applied to the substrate 22, in the x-direction, the substrate and plates move in that direction while the beam 34 tends to remain in its prior condition. Motion of the beam relative to the substrate is permitted by the fact that legs 28 and 32 are not absolutely rigid and will deflect slightly. When the force is in the positive x-direction, the separation between finger 36 and plate 42 increases, decreasing the capacitance in the capacitor they form; conversely, the separation between finger 38 and plate 44 decreases, increasing the capacitance in the capacitor they form.

Figure 6:
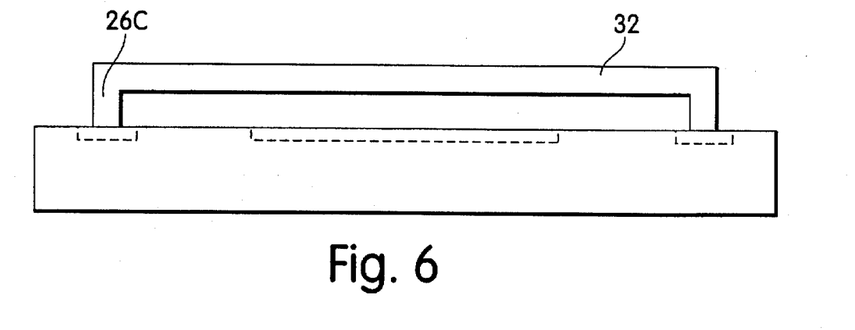
FIG. 6 is a right side view of the structure of FIG. 4 or FIG. 5.

A right side view of the structure of FIG. 4 (or equally, FIG. 5) is shown in FIG. 6, to better illustrate the suspension of the polysilicon beam 24 above the substrate 22. The beam and the plates 42 and 44 rest on posts, or anchors, such as post 26A. The polysilicon is sufficiently rigid as not to sag or deflect into contact with the substrate surface under reasonably foreseeable accelerations.

Figure 7:
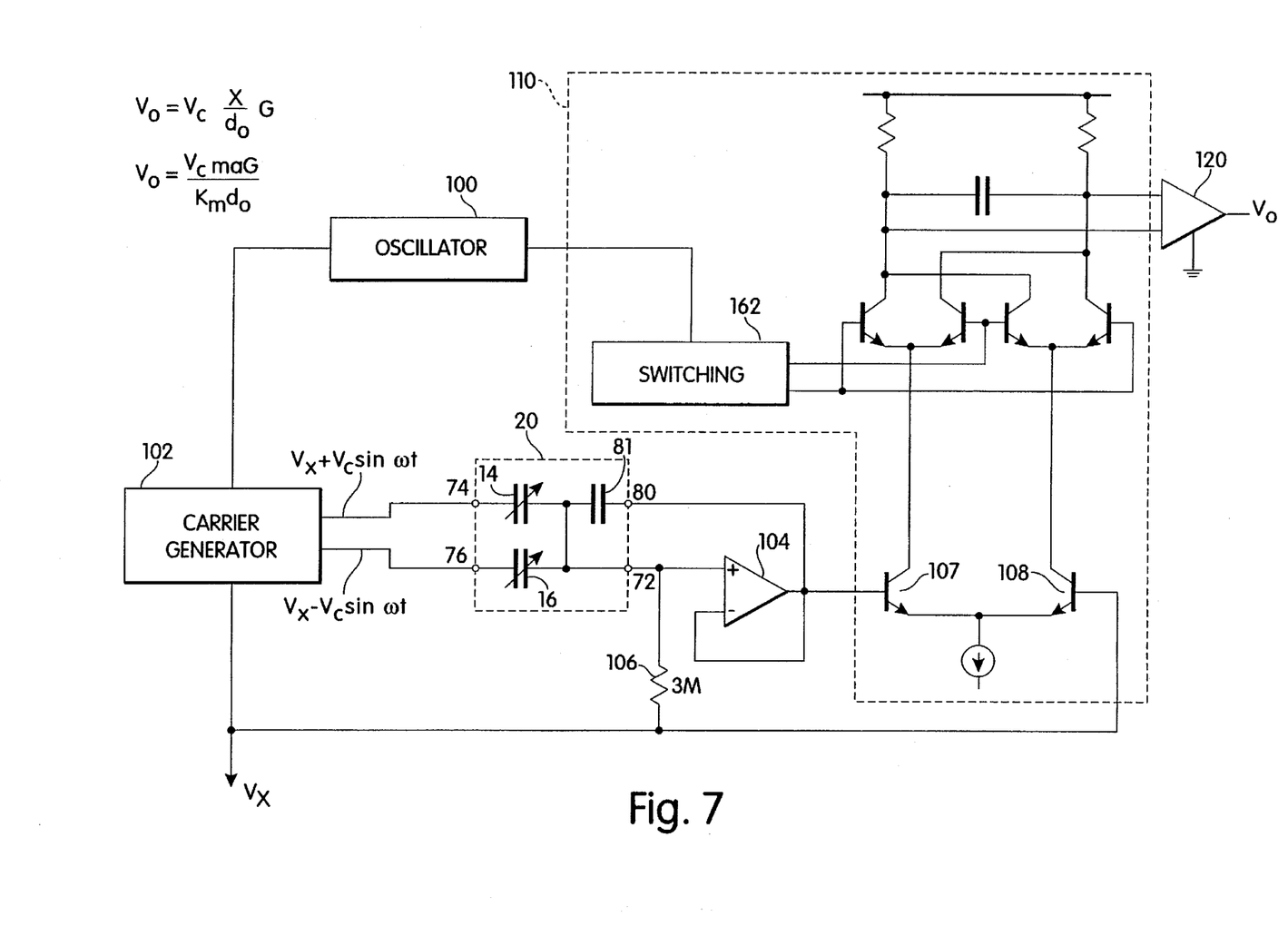
FIG. 7 is a partially block, partially schematic circuit diagram of the first exemplary embodiment of an accelerometer, previously shown in FIG. 3.

FIG. 7 provides a partially block-, partially schematic circuit diagram showing, in greater detail, a first (open-loop) embodiment of signal conditioning circuitry for use with the sensor of FIGS. 4 and 5, for an accelerometer. The oscillator 100 supplies an approximately 1 MHz sinusoidal signal to a carrier generator 102. The carrier generator supplies therefrom two 1 MHz sinusoidal output signals 180 degrees out of phase from each other; thus, the output signals are of the form $V_c \sin wt$ and $-V_c \sin wt$, where w is the angular frequency of the oscillator output signal. The first carrier signal is supplied to terminal 74 of sensor 20, while the second carrier signal is supplied to terminal 76. Sensor output terminal 72 is connected to the non-inverting input of a buffer amplifier 104. The output of the buffer amplifier is connected to sensor terminal 80, the bootstrap diffusion contact. Through this connection, the parasitic capacitance 81 is prevented from loading the common node 72. A large resistance 106 (e.g., 3M) is connected between a reference supply voltage VX and the non-inverting input of buffer 104, to establish a d.c. operating point for the bridge.

The output of the buffer feeds a synchronous switching demodulator 110. The demodulator includes a switching circuit which is connected and responsive to the output of the oscillator 100. The double-ended output from the demodulator is converted to a single-ended output Vo by a buffer amplifier 120. The value of Vo is given by the formula Vo=$V_c$maG/$k_m d_0$, where $V_c$ is the carrier amplitude, m is the bridge mass, a is acceleration, $k_m$ is the beam's mechanical spring constant, $d_0$ is the nominal capacitor gap, and G is a scaling factor which accounts for buffer, demodulator and output amplifier gains.

Figure 8:
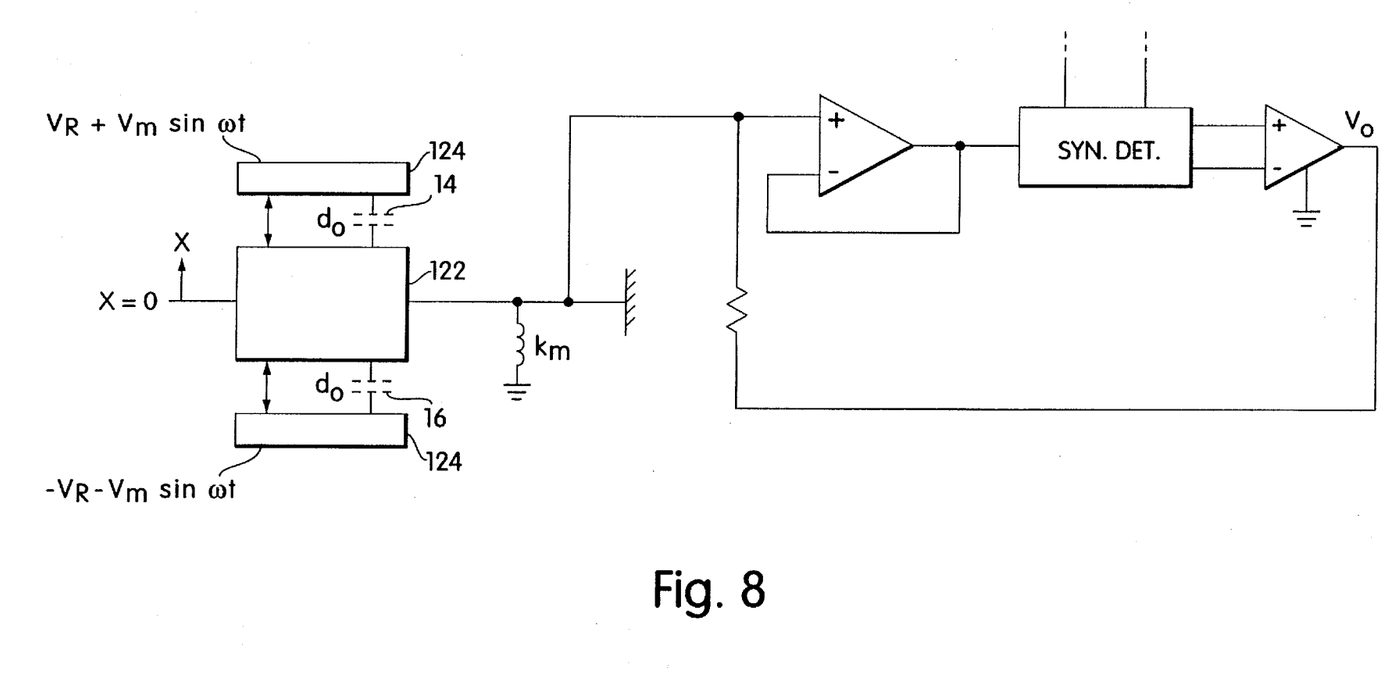
FIG. 8 is a partially diagrammatic, partially schematic circuit model of a second embodiment of an accelerometer according to the present invention.

Turning to FIG. 8, a second embodiment is shown for signal conditioning circuitry employing the sensor of FIGS. 4 and 5. In contrast to the open loop approach of FIG. 7, the apparatus of FIG. 8 is a closed-loop, force-balance accelerometer. To better illustrate the force-balance principle, the bridge/differential-capacitor assembly is modeled as a conductive mass 122 suspended between a first capacitor plate 124 and a second capacitor plate 126, which establishes first and second differential capacitances, the latter being shown as capacitors 14 and 16, respectively. In the force-balance arrangement, capacitors 14 and 16 serve two purposes. First, they provide the means whereby electrostatic balancing forces are applied to the mass 122, at the acceleration frequency. Secondly, they allow the displacement x of the mass (i.e., the bridge mass) to be measured via the differential capacitance, at the carrier frequency. The negative feedback loop adjusts the output voltage Vo so that x=0 and inertial force applied to the bridge equals the net electrostatic force which is applied. The force balance equation is as follows:

$$ma = \frac{\epsilon_0 A_p}{2}\left[\left(\frac{V_R+V_O}{d_o+x}\right)^2 - \left(\frac{V_R-V_O}{d_o-x}\right)^2\right] \quad \text{(Eq. 1)}$$

where m is the mass of the bridge, $\epsilon_0$ is the dielectric constant of air, $AV_p$ is the capacitor plate area (each capacitor, nominal), $d_0$ is the nominal, at rest, capacitor plate separation, x is the change in the capacitor plate separation (i.e., the distance the bridge moves due to the applied force), $V_R$ is the reference or d.c. offset voltage applied to the movable plates, and Vo is the output voltage.

For $x \ll d_0$, at a large loop gain, the output voltage, $V_o$, due to acceleration, is as follows:

$$V_O = \frac{ma\, d_o^2}{2\epsilon_0 A_p V_R}$$

The output voltage is not sensitive to the spring constant of the structure, $k_m$, since the bridge remains undeflected. Full scale adjustment to compensate for values of m, $d_0$ and A which vary from nominal due to process variations can be made by trimming resistors R1 and R2 (shown in FIG. 9).

The beam geometry is designed to minimize the mechanical spring constant, $k_m$, so that a beam initially fabricated off-center will be centered automatically by a small percentage of the full scale electrostatic force. Then, a desired zero "g" output voltage level can be established by trimming the relative carrier amplitudes. Taken to the limit, the mass may be considered floating and self-centering; the mechanical spring constant does, however, prevent the mass from responding to the carrier signal.

Figure 9:
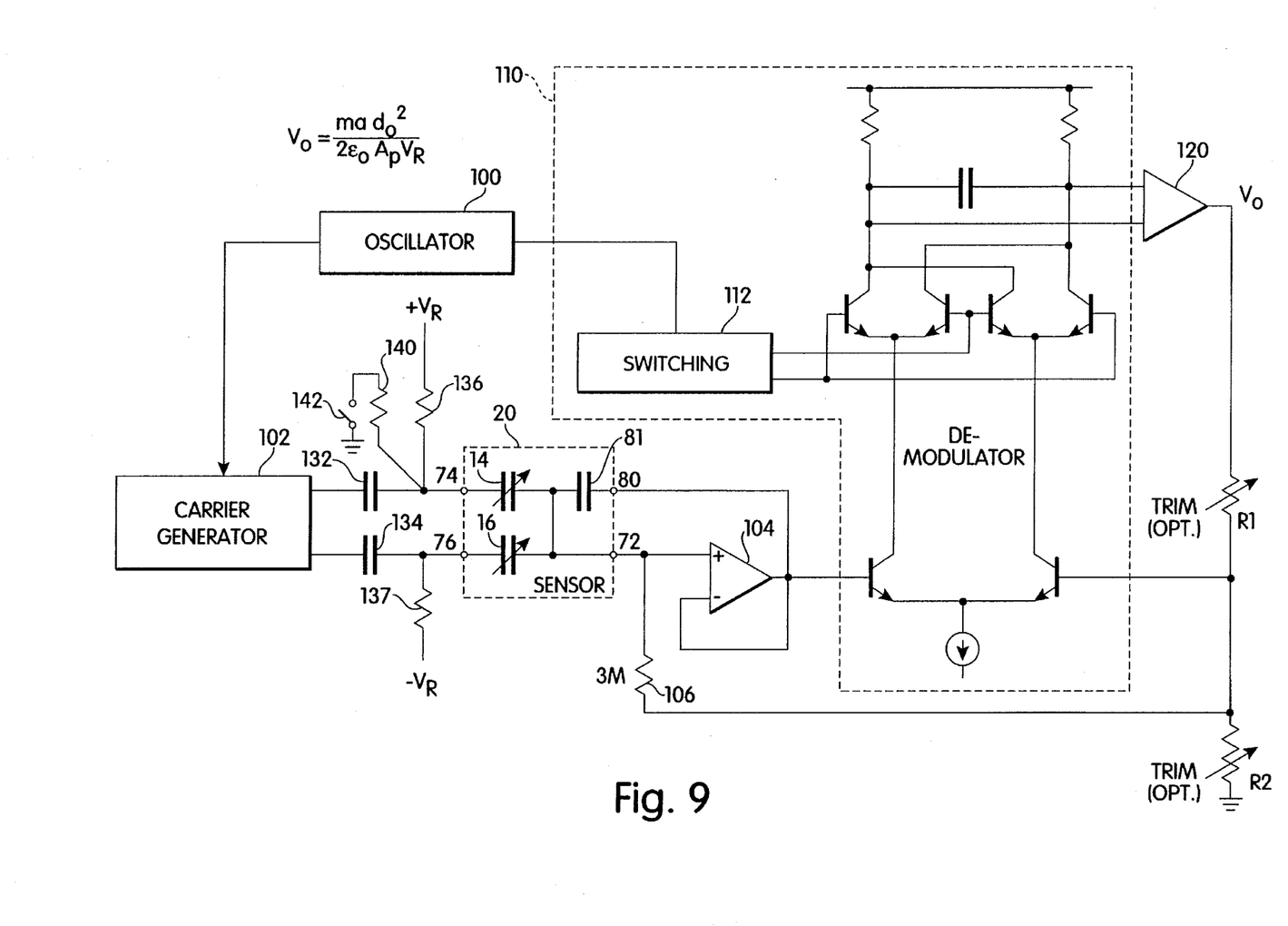
FIG. 9 is a partially block, partially schematic circuit diagram for the embodiment of FIG. 8.

A more detailed design for the force-balance accelerometer of FIG. 8 is shown in FIG. 9. The oscillator 100, carrier generator 102, buffer 104, and demodulator 110 are the same as the corresponding elements of FIG. 7. The carrier generator is, however, a.c.-coupled to the sensor through capacitors 132 and 134. Capacitors 132 and 134 may typically be about 30–50 pF each, to exhibit low impedance at the 1 MHz carrier frequency. To establish a net electrostatic force on the sensor capacitor plates, input terminals 74 and 76 are connected, respectively, to positive and negative offset (i.e., reference) supplies $V_R$ and $-V_R$, through resistors 136 and 138, each typically being about 300 k ohms. When the sensor capacitors 14 and 16 are equal (i.e., acceleration is zero), the electrostatic potential across the capacitors is balanced and equal. By contrast, acceleration causes the capacitors to have different values of capacitance and the electrostatic potential on them to be unequal, causing a net unbalancing force. The demodulator detects this imbalance, which causes a change in the signal at the non-inverting input of amplifier 104, and supplies a feedback signal through resistor 106, to create a net electrostatic force to equalize the inertial force. Thus the feedback signal providing for force-balancing is supplied by connecting the junction of resistor 106 and the second demodulator signal input at the base of transistor 108 to the output of output buffer 120, instead of to fixed source VX.

Optionally, the circuit of FIG. 9 also has a resistor 140 and switch 142 connected in series between node 74 and ground. Closure of the switch will unbalance the input signals applied to nodes 74 and 76, which will apply a momentary electrostatic force on the bridge and produce a corresponding shift in the output to re-center the bridge. The output will be different if one or both capacitors fails (i.e., the bridge is untethered—broken—or the bridge is stuck). Thus, the closure of the switch can be used to test the proper operation of both the sensor and the circuitry.

Figure 10:
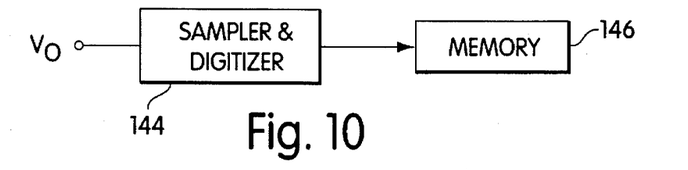
FIG. 10 is a block diagram of an optional sampling system for recording an acceleration profile over a predetermined interval.
Figure 11:
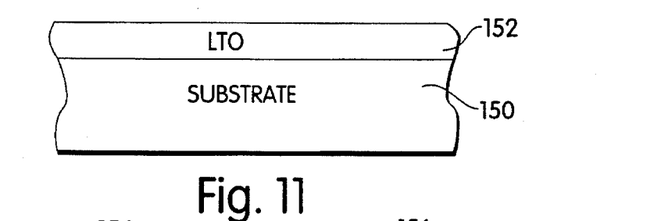
FIGS. 11–14 are diagrammatic illustrations of a sequence of steps for fabricating the differential-capacitor sensor of the present invention.

To provide an acceleration or deceleration profile (e.g., a crash profile), a system such as that shown in FIG. 10 may be used. The output Vo of the accelerometer may be periodically sampled and digitized by a digitizer 144. The digitized samples may be stored in a memory 146 of predetermined size. A useful type of memory might be a FIFO (first in, first out) stack, having enough capacity to store samples representing a predetermined time period. In the event of a collision, the memory would contain the deceleration profile covering the last time segment (e.g., 30 seconds) before the impact.

While FIGS. 3–10 currently represent our preferred embodiments, it will be appreciated that other circuits can be used to detect the differential capacitance between two or more capacitors. For example, a full bridge circuit could be used to generate a signal directly related to capacitance change, with additional circuitry to derive a signal proportional to acceleration.

Figure 12:
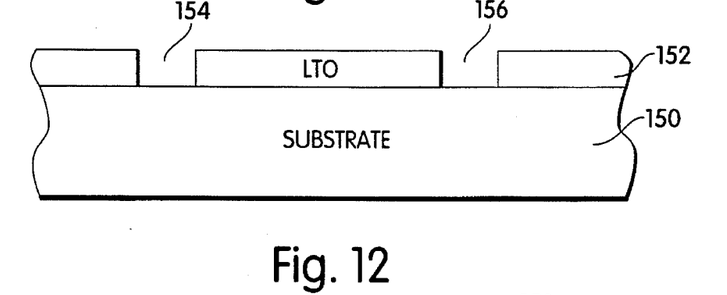
Figure 13:
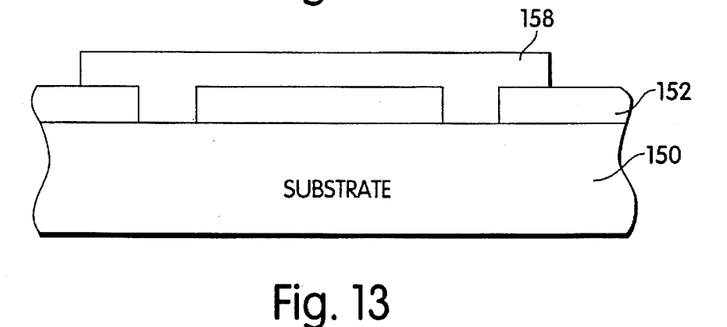
Figure 14:
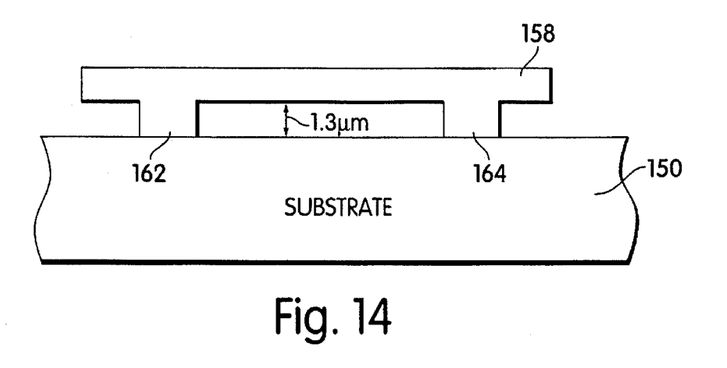

Fabrication of the sensor involves a sequence of several steps, which are broadly illustrated in FIGS. 11–14. Starting with a substrate 150 (see FIG. 11), such as silicon, a low temperature oxide (LTO) layer 152 is grown on its surface. The oxide is then patterned and selectively removed to leave holes such as at 154 and 156 (FIG. 12). A polysilicon layer 158 is deposited. (FIG. 13.) The conductivity of the polysilicon is raised by heavily doping it with an appropriate material, such as phosphorus. This "conductive" polysilicon fills in the holes 154 and 156, and additionally provides a planar covering to the LTO. The polysilicon 158 is then patterned. Next, the LTO is removed, using a wet etch. After the wet etch step, the structure is as shown in FIG. 14, with the planar polysilicon layer supported or suspended on posts, or anchors, such as 162 and 164.

It will be appreciated that the foregoing description of a fabrication process is simplified and that a number of steps have been omitted from the discussion so as not to obfuscate the overall nature of the process.

The differential capacitor arrangement shown above relies upon changing plate separation to alter the capacitances. Capacitance may also be changed by differentially varying plate area or by differentially varying dielectric constant.

Each of the accelerometers shown above, and their functional equivalents, can detect acceleration along only a single axis. Multi-axial sensing can be achieved, though, by combining orthogonally disposed sensors. Indeed, the monolithically fabricated structure of FIGS. 4–7 is so small that it is well within the state of the art to fabricate two orthogonally oriented sensors and their associated signal conditioning circuits on a single substrate. An auxiliary beam(s) can also be provided, to detect and reject off-axis acceleration, and to correct for acceleration components not of interest.

The sensor and circuitry disclosed herein provide an excellent, low-cost "complete" accelerometer. It is monolithically fabricated using normal semiconductor processing equipment and technique (though the actual steps of the production method are new). The sensors are small and signal processing circuits are not complex, so multiple accelerometers can be made on the same substrate. Calibration is possible as part of the normal wafer probing operation during manufacture, without the need for mechanical "g" forces to be applied. Sensor transduction is first-order linear and the capacitors are much less temperature sensitive than piezo-resistive devices. A self-test is easily implemented, so that operability of the accelerometer can be confirmed at any time. Because the output of the accelerometer is an electrical signal which (to a first order) varies linearly with acceleration, it may be recorded as an analog signal or it may be sampled periodically and acceleration values over a predetermined interval may be stored digitally in a memory (e.g., nonvolatile RAM). This provides a record of the acceleration measures for some time prior to a crash—i.e., a crash profile. These features, individually and in various combinations, substantially fulfill the objectives set forth above.

Ideally, the sensor and signal conditioning circuits will be manufactured to such close tolerance that calibration will be unnecessary. As a practical matter, however, using present manufacturing technology, an accuracy band of only about ±10–15% can be achieved in uncalibrated devices. The primary cause of the deviation from ideal is the variation in the capacitor gap. By an appropriate choice of internal measurements, and their use in a mathematical expression that has a relatively strong dependence on the capacitor gap dimension, the value of that gap can be deduced on a chip-by-chip basis. Then, knowing that the full scale acceleration output is also primarily a function of the capacitor gap, the output amplifier gain can be trimmed appropriately so that an ideal value of output voltage can be approached for the specified full scale acceleration input.

The change in output voltage with acceleration, ignoring post-amplification, for the closed-loop force-balanced architecture is given by:

$$V_O = \frac{m a \, d_0^2}{2\epsilon_0 A_p V_R} \qquad \text{(Eq. 2)}$$

where $d_0$ is the capacitor gap, $A_p$ is capacitor area, and $V_R$ is a d.c. voltage.

The change in output voltage is a function of the square of the capacitor gap. The gap size is controlled by the etching process. Note that this equation has been simplified to remove the terms dependent on the spring constant of the beam, since with the loop gain of 10, that dependence is quite secondary.

Figure 15:
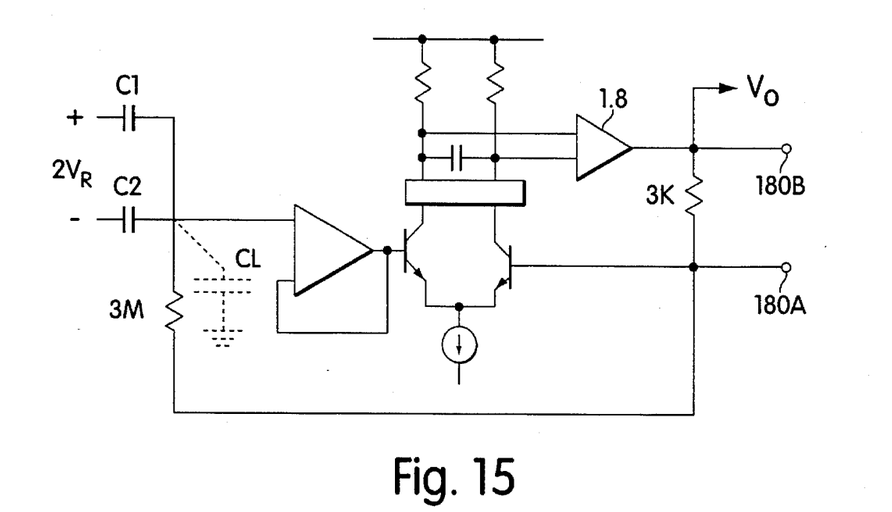
FIG. 15 is a simplified schematic diagram of a circuit architecture for use in trimming the accelerometer structure according to the invention.

A suitable process for trimming the accelerometer will be explained with reference to FIG. 15, which shows the simplified closed-loop architecture, on which a series of open-loop measurements are made. First, a static value of a voltage $V_B$ is applied to test point 180A, to develop a net electrostatic force on the sensor beam. The beam will deflect until the beam's mechanical restoring force $F_m$ just equals the electrostatic force $F_e$; that is, $F_m=F_e$. Applying the known relationships $F_m=k_m x$, where x is deflection, and $F_e$ equals the expression of Eq. 1 (with an appropriate sign change), one can then write $$k_m x = \frac{\epsilon_o A_p}{2 d_o^2} \left\{ \frac{(V_R - V_B)^2}{(1 - x/d_o)^2} - \frac{(V_R + V_B)^2}{(1 + x/d_o)^2} \right\} \quad \text{(Eq. 3)}$$

Figure 16:
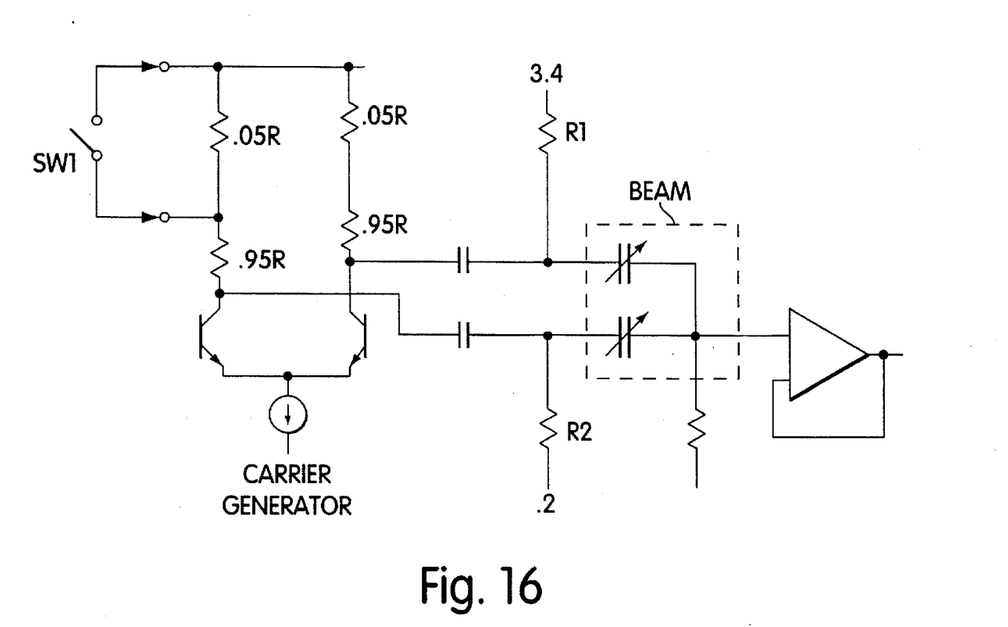
FIG. 16 is a simplified schematic diagram of a circuit for changing the relative carrier amplitudes applied to the accelerometer transducer during the trimming process.

(Of course, the absence of inertial force is implied.) $V_R$ is easily measured, $V_B$ is known since it is forced relative to the average of the capacitor plate voltages and $V_o$ is also measured relative to the same quantity. $V_o$ is measured at test point 180B. Note that the capacitor area $A_p$ equals $t*l$, where t is the thickness of the polysilicon, and is unknown, and l is the capacitor length, and is known. The output $V_o$ in FIG. 15 is proportional to the fractional deflection, $x/d_o$, of the beam in the gap.

$$V_{o1} = \frac{G_1 l x}{d_o} \quad \text{(Eq. 4)}$$

where $G_1$ has several components:

$G_1 = K_r S A_1 A_2 V_c$. $K_r = (C_1 + C_2)/(C_1 + C_2 + C_L)$ is the beam loading factor. $C_L$ is a parasitic beam to substrate capacitance. S is the carrier efficiency factor, with S=1 for a square wave and S=2/3.14 for a sine wave. $V_c$ is the carrier amplitude. $A_1$ is the gain factor taking into account the buffer, demodulator gain, and loss of signal due to timing non-idealities between the demodulator switching and carriers. $A_2$ is the gain internal to the output amplifier. $G_1$ can be measured directly by changing the relative amplitude of the carriers and creating an effective $\Delta x/d_0$ value. One way for changing the relative amplitudes of the carriers is indicated in FIG. 16. Switch SW1 may be a relay which, depending on its state, will allow equal amplitude carriers or unequal amplitude carriers. $\Delta V_{o1}$ is measured by holding test point 180A at the static voltage $V_B$ that is equal to the average of the capacitor plate voltages and measuring the difference in output voltage $V_o$ with switch SW1 open and closed. Then $\Delta x/d_o = \Delta V_{o1}/G_1$. Substituting Eq. 4 into Eq. 3 yields:

$$k_m \frac{\Delta V_{o1}}{G_1} d_o = \frac{\epsilon_o A_p}{2 d_o^2} \left\{ \frac{(V_R - V_B)^2}{(1 - \Delta V_{o1}/G_1)^2} - \frac{(V_R + V_B)^2}{(1 + \Delta V_{o1}/G_1)^2} \right\} \quad \text{(Eq. 5)}$$

The unknowns in Eq. 5 are $k_m$, $d_o$, and $A_p$ (or, more precisely, t). The beam spring constant $k_m$ is a function of the beam resonant frequency, $f_o$, which can be measured:

$$f_o = \frac{1}{2\pi} \sqrt{\frac{k_m}{m}} \quad \text{(Eq. 6)}$$

Thus, $k_m 32 f_o^2 (2\pi)^2 m$ (Eq. 7).
Substituting Eq. 7 into Eq. 5, yields $$(2\pi f_o)^2 \frac{m \Delta V_{o1} d_o}{G_1} = \frac{\epsilon_o l w}{2 d_o^2} Z \quad \text{(Eq. 8)}$$

where $m = DWA_B$ and D is the density of the polysilicon, W is the thickness of the polysilicon and $A_B$ is the beam area. Z is the quantity in braces in Eq. 5. Substituting the the above expression for "m" into Eq. 8, one obtains $$\frac{(2\pi f_o)^2 D A_B \Delta V_{o1} d_o^3}{G_1} = \frac{\epsilon_o l Z}{2} \quad \text{(Eq. 9)}$$

where l is the total gap length, which will not vary much at all with processing. Eq. 9 is solved for "$d_o$". The quantities $f_o$, $\Delta V_{o1}$, $V_R$, $V_B$ and $G_1$ are determined by measurement. D, $\epsilon_o$, $A_B$ and l are invariant. W does in reality contribute small potential errors in the solution for the capacitor gap, though it was cancelled from both sides of the equation. Once "$d_o$" is known, the gain of the circuit can be trimmed, by adjusting resistors R1 and R2 shown in FIG. 9, to the appropriate value of output voltage for a full scale acceleration signal.

Other calibration techniques can be used as well, of course. The advantage of the above-described technique is that it avoids the application of calibrated mechanical acceleration forces.

Having thus described the basic concept of the invention, it will be readily apparent to those skilled in the art that the foregoing detailed disclosure is intended to be presented by way of example only, and is not limiting. Various alterations, improvements, and modifications will occur and are intended to those skilled in the art, though not expressly stated herein. These modifications, alterations, and improvements are intended to be suggested hereby, and are within the spirit and scope of the invention. Accordingly, the invention is limited only by the following claims and equivalents thereto:

What is claimed is:

1. A method for adjusting the full scale sensitivity of a capacitance-type acceleration sensor, said sensor comprising first and second capacitors, each having first and second electrodes, said first electrode of said first capacitor being coupled electrically to said first electrode of said second capacitor, forming a differential capacitor arrangement;

in each of the capacitors, a first one of the electrodes being substantially stationary and a second one of the electrodes being moveable in response to applied acceleration, whereby an accelerative force causes said moveable electrodes to move relative to said substantially stationary electrodes and alter the capacitance between each of said moveable electrodes and said corresponding substantially stationary electrodes, resolving circuitry coupled to said moveable and substantially stationary electrodes for generating in response to movement of said moveable electrodes a signal indicative of acceleration, said resolving circuitry comprising:

means for generating first and second sinusoidal signals of equivalent amplitude and frequency and 180° out of phase with each other;

means for supplying said first sinusoidal signal to said first capacitor, means for supplying said second sinusoidal signal to said second capacitor, a buffer amplifier having an input coupled to said first and second capacitors and an output, a demodulator having an input coupled to said output of said buffer amplifier and an output, an output amplifier coupled to said output of said demodulator and having an output, and a first resistor having a first terminal coupled to said output of said output amplifier and a second terminal coupled, through a second resistor, to said first electrodes of said capacitors, comprising the steps of:
1) applying a specified voltage at said second terminal of said first resistor,
2) measuring an output voltage at said first terminal of said first resistor resulting from step (1),
3) changing the amplitude of the carrier signals so as to simulate a displacement of said second electrodes relative to said first electrodes,
4) measuring the resulting voltage change, $\Delta V_{o1}$, at said first terminal of said first resistor,
5) calculating a gain factor, G, based on the voltage change measured in step (4),
6) measuring a beam resonant frequency, fo,
7) calculating a capacitor gap value, between said electrodes of said capacitors for said acceleration sensor,
8) calculating a preliminary sensitivity, of said acceleration sensor, and
9) trimming said resolving circuitry based on said preliminary sensitivity so as to set a final full scale sensitivity of said acceleration sensor.

2. A method as set forth in claim 1 wherein step (3) comprises switching said carrier signals from having equal amplitudes to having unequal amplitudes.

3. A method as set forth in claim 2 wherein step (9) comprises determining a full scale output voltage of said accelerometer in response to a predetermined acceleration value.

* * * * *